US012671052B2

(12) United States Patent
Ogawa et al.

(10) Patent No.: US 12,671,052 B2
(45) Date of Patent: Jun. 30, 2026

(54) OBJECTIVE LENS AND CHARGED PARTICLE BEAM APPARATUS INCLUDING SAME

(71) Applicant: KOREA RESEARCH INSTITUTE OF STANDARDS AND SCIENCE, Daejeon (KR)

(72) Inventors: Takashi Ogawa, Daejeon (KR); In Yong Park, Daejeon (KR); Jeong Woong Lee, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 371 days.

(21) Appl. No.: 18/519,865

(22) Filed: Nov. 27, 2023

(65) Prior Publication Data

US 2025/0046562 A1 Feb. 6, 2025

(30) Foreign Application Priority Data

Aug. 4, 2023 (KR) ........................ 10-2023-0102420

(51) Int. Cl.
*H01J 37/12* (2006.01)
*H01J 37/244* (2006.01)
*H01J 37/28* (2006.01)

(52) U.S. Cl.
CPC ............ *H01J 37/12* (2013.01); *H01J 37/244* (2013.01); *H01J 37/28* (2013.01); *H01J 2237/24475* (2013.01); *H01J 2237/2448* (2013.01)

(58) Field of Classification Search
CPC .. H01J 37/00; H01J 37/02; H01J 37/12; H01J 37/244; H01J 37/26; H01J 37/28; H01J 37/145; H01J 37/10; H01J 37/147; H01J 2237/24475; H01J 2237/2448
USPC ................................ 250/306, 307, 310, 311
See application file for complete search history.

(56) References Cited

U.S. PATENT DOCUMENTS

| | | | | |
|---|---|---|---|---|
| 6,104,034 A | * | 8/2000 | Frosien ................. | H01J 37/145 |
| | | | | 250/396 ML |
| 6,590,210 B1 | * | 7/2003 | Essers ................... | H01J 37/244 |
| | | | | 250/397 |
| 2004/0211913 A1 | * | 10/2004 | Petrov ..................... | H01J 37/28 |
| | | | | 250/396 R |
| 2014/0211913 A1 | * | 7/2014 | Pan .......................... | A61B 6/06 |
| | | | | 378/19 |
| 2017/0154752 A1 | * | 6/2017 | Essers ..................... | H01J 37/18 |

* cited by examiner

*Primary Examiner* — Jason L Mccormack
(74) *Attorney, Agent, or Firm* — Paratus Law Group, PLLC

(57) ABSTRACT

An objective lens for a charged particle beam apparatus that provides a charged particle beam to a sample, includes: a first electrode exposed to face a sample; a second electrode configured to focus a charged particle beam to the sample; a third electrode comprising a conical tip and a body extending from the tip; and a fourth electrode located in the body of the third electrode. Each of the first electrode, the second electrode, the third electrode, and the fourth electrode has a through-hole, and the charged particle beam is provided to the sample through the through-hole in response to a voltage applied.

21 Claims, 8 Drawing Sheets

OBJECTIVE LENS AND CHARGED PARTICLE BEAM APPARATUS INCLUDING SAME

CROSS REFERENCE TO RELATED APPLICATION

The present application claims priority to Korean Patent Application No. 10-2023-0102420 (filed Aug. 4, 2023), which is hereby incorporated by reference in its entirety.

BACKGROUND

The present disclosure relates to an objective lens and a charged particle beam apparatus including the same.

A charged particle beam apparatus is configured to determine characteristics of a sample by imaging the sample by irradiating the surface of the sample with charged particles emitted from a charged particle source by means of a charged particle optical system using a magnetic or electric field. The charged particle beam apparatus is widely used in the fields of materials science, nanoscience, electronics, etc. Microscopy based on the charged particle beam apparatus has a superior spatial resolution to enable the observation of microstructures such as thin films grown on substrates, nanotubes, plasmonic structures, and atomic arrangements of samples not observable in optical microscopy. In addition, the charged particle beam apparatus may also serve to observe the microstructure of biological samples such as cells, determine the crystal structure of samples and the like through electron diffraction imaging.

Among charged particle beam apparatuses, a scanning electron microscope (SEM) is configured to use an electron source as a charged particle source equivalent to the light source of an optical microscope, scan a sample with a focused beam of electrons, and detect signal electrons to form a microscopic image. Recently, scanning electron microscopy has been focused observations in low-energy electron beam conditions may improve information that may be obtained from sample surfaces and may avoid electrification of or damage to the sample.

A low-energy electron beam may degrade the resolution of the charged particle beam apparatus by increasing chromatic aberration due to the energy width or diffraction aberration due to the wavelength of the electron beam. In order to overcome or reduce the problem, scanning electron microscopes including objective lenses with low aberration coefficients capable of reducing the focal distance to the sample and improving the resolution are being developed.

On the other hand, the sample in an SEM is placed in a vacuum sample chamber evacuated to a high vacuum, typically within $1 \times 10^{-3}$ to $10^{-4}$ Pa. However, at such a vacuum level, the sample chamber contains a hydrocarbon gas, and when the sample is irradiated with an electron beam, carbide produced by the decomposition of the hydrocarbon gas often adheres to the sample, thereby resulting in contamination.

The foregoing is desirable merely to aid in the understanding of the background of the present disclosure, and is not desirable to mean that the present disclosure falls within the purview of the related art that is already known to those skilled in the art.

SUMMARY

A scanning electron microscope (SEM) objective lens, a detector is disposed above the objective lens to detect signals such as secondary electrons and backscattered electrons pulled into the objective lens, thereby forming a microscopic image.

However, the secondary electrons pulled into the objective lens collide with electrodes to reproduce undesirable secondary electrons to form noise, by which image quality is degraded and, furthermore, the electrodes and detector are damaged and contaminated.

One of objectives of embodiments of the present disclosure is to overcome the above-described problems of the related art. Another one of objectives of embodiments of the present disclosure is to provide an objective lens for a charged particle beam apparatus, the objective lens being able to prevent secondary electrons pulled into the objective lens from colliding with electrodes and reproducing undesirable secondary electrons.

According to an embodiment of the present disclosure, there is provided an objective lens for a charged particle beam apparatus that provides a charged particle beam to a sample, the objective lens including: a first electrode exposed to face a sample; a second electrode configured to focus a charged particle beam to the sample; a third electrode including a conical tip and a body extending from the tip; and a fourth electrode located in the body of the third electrode, wherein each of the first electrode, the second electrode, the third electrode, and the fourth electrode has a through-hole, and the charged particle beam is provided to the sample through the through-hole in response to a voltage applied.

According to an aspect of the embodiment, each of the first electrode and second electrode may include the conical tip and the body extending from the tip. The second electrode may be located within the first electrode with a gap from the first electrode. The third electrode may be located within the second electrode with a gap from the second electrode.

According to an aspect of the embodiment, the fourth electrode may be mounted with a detector configured to detect secondary electrons and backscattered electrons formed by providing the charged particle beam to the sample. The fourth electrode may be disposed at a position having highest detection efficiency irrespective of shapes of the first electrode, the second electrode, and the third electrode.

According to an aspect of the embodiment, the third electrode further may include a flange extending from the body of the third electrode. The first electrode may further include a first electrode insulator connected to the flange. The second electrode may further include a second electrode insulator connected to the flange.

According to an aspect of the embodiment, the second electrode may be provided with a voltage corresponding to one of a distance between the first electrode and the sample and the energy of the charged particle beam.

According to an aspect of the embodiment, a voltage difference of 50 V or less may be formed between the third electrode and the fourth electrode.

According to an aspect of the embodiment, a voltage provided to the second electrode may be independent of a voltage provided to the third electrode.

According to an aspect of the embodiment, the objective lens may be an objective lens of an SEM.

According to another embodiment of the present disclosure, there is provided an objective lens for a charged particle beam apparatus that provides a charged particle beam to a sample, the objective lens including: a first electrode including a conical tip and a body extending from the tip, the first electrode being exposed to face a sample; a second electrode including a conical tip and a body extending from the tip, located in the first electrode, and configured to focus a charged particle beam to the sample; a third electrode including a conical tip and a body extending from the tip, the third electrode being located in the second electrode; and a fourth electrode located in the body of the third electrode, wherein each of the first electrode, the second electrode, the third electrode, and the fourth electrode has a through-hole, and the charged particle beam is provided to the sample through the through-hole in response to a voltage applied.

According to an aspect of the embodiment, the fourth electrode may be mounted with a detector configured to detect secondary electrons and backscattered electrons formed by providing the charged particle beam to the sample. The fourth electrode may be disposed at a position having highest detection efficiency of the secondary electrons and the backscattered electrons irrespective of shapes of the first electrode, the second electrode, and the third electrode.

According to an aspect of the embodiment, the tip of the first electrode, the tip of the second electrode, and the tip of the third electrode may include distal ends in parallel to each other, respectively. The thickness of the tip of the first electrode may be greater than 0 mm and is equal to or less than 3 mm.

According to an aspect of the embodiment, a gap between the first electrode and the second electrode may be greater than 0 mm and is equal to or less than 4 mm.

According to an aspect of the embodiment, the diameter of the through-hole provided in each of the first electrode, the second electrode, and the third electrode may be equal to or greater than 3 mm.

According to an aspect of the embodiment, the objective lens may be an objective lens of an SEM.

According to another embodiment of the present disclosure, there is provided a charged particle beam apparatus including: a charged particle source; one or more condenser lenses configured to focus a charged particle beam; an objective lens configured to imaging a sample by irradiating the sample with the charged particle beam; and a detector configured to detect secondary electrons and backscattered electrons generated from the sample. The objective lens may include: a first electrode including a conical tip having a through-hole and a body extending from the tip, the first electrode being exposed to face a sample; a second electrode including a conical tip having a through-hole and a body extending from the tip, exposed in the first electrode, and configured to focus a charged particle beam to the sample; a third electrode including a conical tip having a through-hole and a body extending from the tip, the third electrode being located in the second electrode; and a fourth electrode located in the body of the third electrode and having a through-hole.

According to an aspect of the embodiment, the detector may include: a first detector configured to detect the secondary electrons and the backscattered electrons; and a second detector configured to detect the secondary electrons and the backscattered electrons that have passed through the first detector.

According to an aspect of the embodiment, the first detector may be mounted on the fourth electrode, and is disposed at a position having highest detection efficiency of the secondary electrons and the backscattered electrons irrespective of shapes of the first electrode, the second electrode, and the third electrode.

According to an aspect of the embodiment, the second electrode may be provided with a voltage corresponding to one of a distance between the first electrode and the sample and the energy of the charged particle beam.

According to an aspect of the embodiment, a voltage provided to the second electrode may be independent of a voltage provided to the third electrode.

According to an aspect of the embodiment, a voltage difference of 50 V or less may be formed between the third electrode and the fourth electrode.

According to an aspect of the embodiment, a gap between the first electrode and the second electrode may be equal to or less than 4 mm. The thickness of the tip of the first electrode may equal to or less than 3 mm. The diameter of the through-hole provided in each of the first electrode, the second electrode, and the third electrode may equal to or greater than 3 mm.

According to an aspect of the embodiment, the charged particle beam apparatus may include one of an SEM, an analyzer including a spectrometer configured to analyze electron beam energy, and a sample processing apparatus.

According to embodiments of the present disclosure, contamination caused by secondary electrons generated on the surface of the detector colliding with a high-potential electrode may be restrained and performance degradation of the objective lens may be reduced, thereby enabling long-term reliable use.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 5 is a diagram schematically illustrating the parameters of the first electrode, the second electrode, the third electrode, and electrodes according to embodiments.

DETAILED DESCRIPTION

Figure 1:
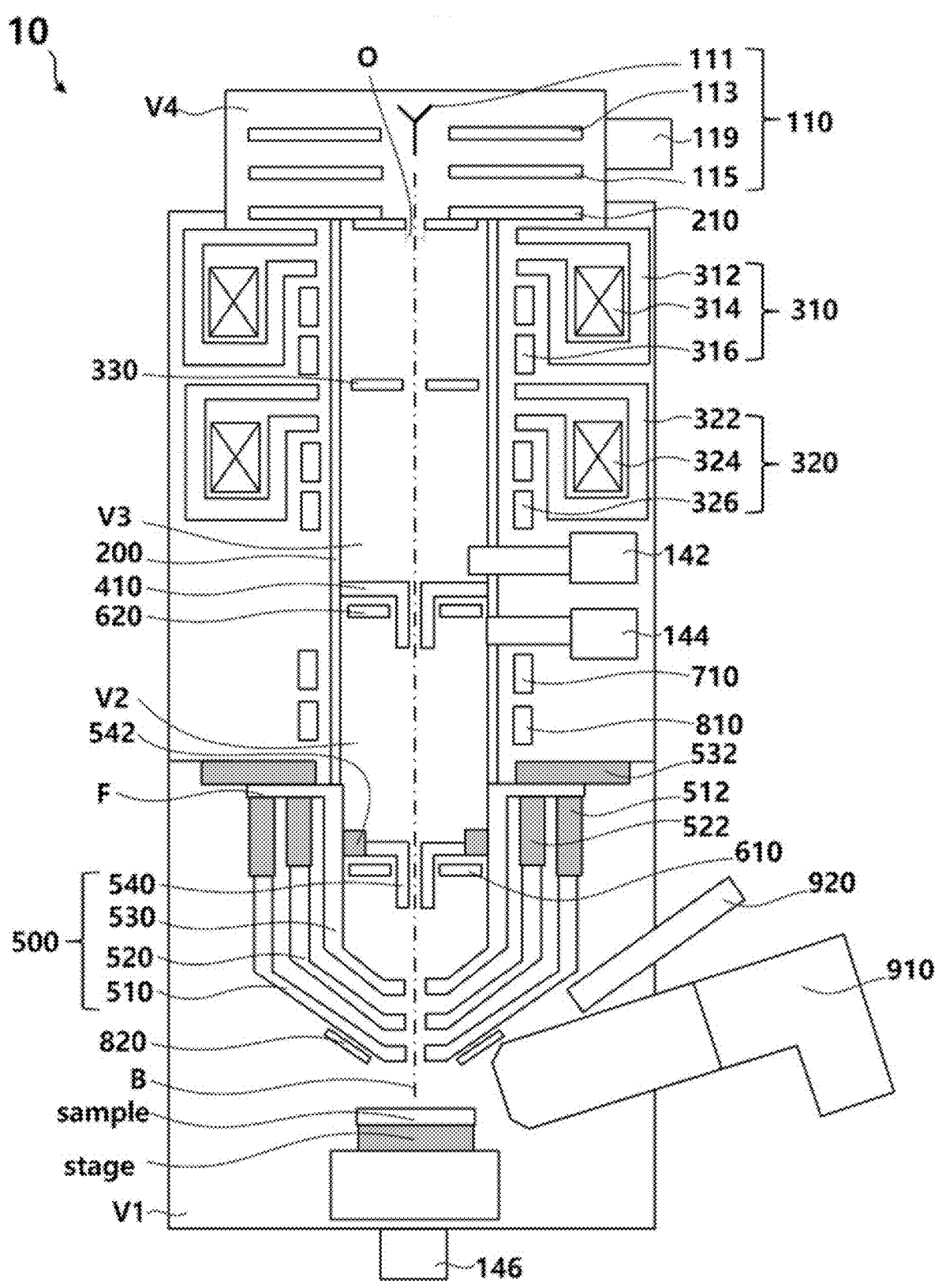
FIG. 1 is a block diagram schematically illustrating a charged particle beam apparatus including an objective lens according to embodiments of the present disclosure.

Hereinafter, embodiments of the present disclosure will be described with reference to the accompanying drawings. FIG. 1 is a block diagram schematically illustrating a charged particle beam apparatus 10 including an objective lens according to embodiments of the present disclosure. Referring to FIG. 1, the charged particle beam apparatus 10 according to embodiments includes: a charged particle or electron source 110; one or more condenser lenses 310 and 320 configured to focus a charged particle beam; an objective lens 500 configured to direct the charged particle beam to a sample; and detectors 610 and 620 configured to detect secondary electrons and backscattered electrons generated from the sample. The objective lens 500 includes: a first electrode 510 including a conical tip having a through-hole and a body extending from the tip, and exposed to face the sample; a second electrode 520 including a conical tip having a through-hole and a body extending from the tip, and located within the first electrode; a third electrode 530 including a conical tip having a through-hole and a body extending from the tip, and located within the second electrode 520; and a fourth electrode 540 located in the body of the third electrode 530 and having a through-hole.

The charged particle beam apparatus 10 illustrated in FIG. 1 may be a scanning electron microscope (SEM), and may further include a spectrometer 910 and a lower detector 920. Secondary electrons and backscattered electrons generated from the sample may be incident to the spectrometer 910, which may analyze the energies of the secondary electrons and the backscattered electrons to detect elements, chemical bonding states, interband transitions, and phonons, or molecular vibrational states on the surface of the sample. Some of the secondary electrons and the backscattered electrons generated from the sample may be detected by the lower detector 920.

A not shown embodiment of another charged particle beam apparatus may include a focused ion beam system such as focused ion beam (FIB) optics and a lower detector. The arrangement state of the FIB optics may switch between a state of being tilted with respect to a stage on which the sample is placed and a state of being perpendicular to the stage. The focused ion beam may etch a sample, depositing a film on the sample, and processing the sample in a region of interest (RoI) in a local and microscopic scale. When processing the sample with focused ion beams, the surface of the sample may be oriented so that the FIB optics are perpendicular to the sample. According to this embodiment, the charged particle beam apparatus may serve as a sample processing apparatus, and an area processed by the ion beam may be observed using an SEM having an electrostatic objective lens at high magnification without moving the sample. The charged particle beam apparatus illustrated in FIG. 1 may be an SEM, an analyzer including a spectrometer analyzing the energy of an electron beam, and a sample processing apparatus including the FIB optics.

Referring to FIG. 1, the electron source 110 includes a filament 111, a suppressor electrode 113, an extractor electrode 115, and a vacuum pump for electron source 119. The vacuum pump for electron source 119 evacuates the interior of the electron source 110 to a desirable vacuum level.

The filament 111 generates charged particles. In an embodiment, the filament 111 may be a thermionic device emitting electrons when heated. As current is applied to the filament 111, the filament 111 is heated to emit electrons. In an example, the filament may be made of any one selected from among lanthanum hexaboride (LaB$_6$) single crystal, cerium hexaboride (CeB) single crystal, and tungsten coated with zirconia (ZrO—W), and tungsten (W).

The suppressor electrode 113 prevents generated charged particles from electron radiation in any direction, and the extractor electrode 115 withdraws the charged particles in an intended direction.

In an embodiment, the charged particle beam apparatus 10 may further include a beam electrode 210 configured to determine the energy of a charged particle beam B provided by the electron source 110. The beam electrode 210 may be connected to a beam tube 200 configured to form a path on which the charged particle beam B travels. In an embodiment, the interior of the beam tube 200 may evacuated to a desirable vacuum level by a third area vacuum pump 142 and a second area vacuum pump 144.

In the illustrated embodiments, the charged particle beam apparatus 10 includes a first condenser lens 310 and a second condenser lens 320. The first condenser lens 310 is configured such that a coil 314 is wound on a yoke 312 having a gap. A magnetic flux generated by the coil 314 is emitted through the gap in the yoke 312, thereby enabling the first condenser lens 310 to act as a lens to focus the charged particle beam B. The spot size of the charged particle beam B is determined by the first condenser lens 310 and an aperture 330, and charged particle beam current is determined by the first condenser lens 310 and the aperture 330. In an embodiment, the first condenser lens 310 may further include an optical axis aligner 316 to align the charged particle beam B to the optical axis of the first condenser lens 310.

The second condenser lens 320 is configured such that a coil 324 is wound on a yoke 322 having a gap. A magnetic flux generated by the coil 324 is discharged through the gap in the yoke 322, thereby enabling the second condenser lens 320 to act as a lens to focus the charged particle beam B. The second condenser lens 320 controls the convergent angle at which the charged particle beam B is focused. In an embodiment, the second condenser lens 320 may further include an optical axis aligner 326 to align the charged particle beam B to the optical axis of the second condenser lens 320

The astigmatism of the charged particle beam B that has passed through openings formed in a detector cover 410 and the second upper detector 620 is corrected by a stigmator 710. Low magnification scanning is performed by a sub-scanner 810. As described below, high magnification scanning of the charged particle beam B is controlled by a main scanner 820 before the charged particle beam B is provided to the sample.

Figure 2:
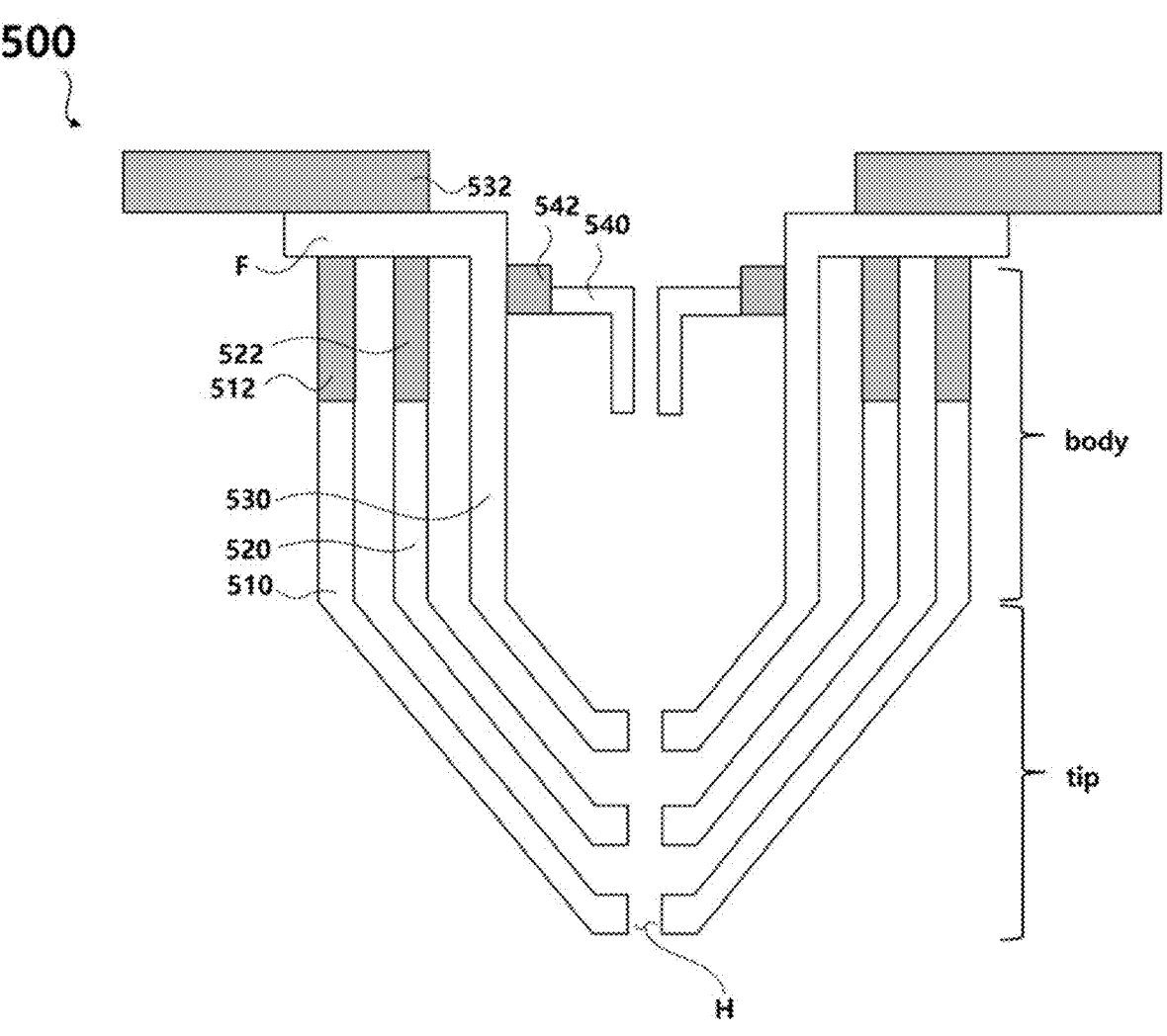
FIG. 2 is a diagram schematically illustrating the objective lens.

FIG. 2 is a diagram schematically illustrating the objective lens 500. Referring to FIGS. 1 and 2, the objective lens 500 includes the first electrode 510, the second electrode 520, the third electrode 530, and the fourth electrode 540. The charged particle beam B incident to the objective lens 500 is focused and provided to the sample by an electric field generated by voltages applied to the first electrode 510, the second electrode 520, the third electrode 530, and the fourth electrode 540.

The first electrode 510, the second electrode 520, the third electrode 530, and the fourth electrode 540 are disposed to overlap while being spaced apart from each other, and are each other electrically insulated using respective insulators. The first electrode 510, the second electrode 520, the third electrode 530, and the fourth electrode 540 may be formed of conductive materials, respectively. In an embodiment, each of the first electrode 510, the second electrode 520, and the third electrode 530 includes a cylindrical body and a conical tip connected to the body. Distal ends each having a thickness are located on the tips, respectively, to be parallel to each other. The tip is provided with a through-hole H capable of providing the charged particle beam B toward the sample.

In a not shown embodiment, each of the first electrode, the second electrode, and the third electrode includes a polygonal body and a polygonal pyramidal tip connected to the body. The tip is provided with a through-hole capable of providing the charged particle beam toward the sample.

The third electrode 530 is connected to the beam tube 200. In addition, the third electrode 530 may be electrically connected to the beam electrode 210 through the beam tube 200.

The third electrode 530 may further include a flange F extending from the third electrode body. The body of the first electrode 510 may be connected to the flange F through a first electrode insulator 512, and an electrical insulation is maintained therebetween. The body of the second electrode 520 may be connected to the flange F through a second electrode insulator 522, and an electrical insulation is maintained therebetween. In addition, the flange F may be fixed to the wall of the charged particle beam apparatus 10 by means of the third electrode insulator 532.

The fourth electrode 540 may be disposed within the body of the third electrode 530. The fourth electrode 540 may be insulated by means of the fourth electrode insulator 542 and be disposed within the body of the third electrode 530. As in the illustrated embodiment, the shape of the top surface of the fourth electrode 540 connected to the fourth electrode insulator 542 may match the cross-sectional shape of the beam tube 200 and/or the cross-sectional shape of the third electrode 530. The fourth electrode 540 may further include an opening and a protruding structure in which the opening extends along the beam path of the charged particle beam B. The first upper detector 610 may be located around the protruding structure. In an embodiment, the fourth electrode 540 and the first upper detector 610 may be in a coupled state. In an embodiment, the diameter of the opening may be 2 mm or less.

According to the related art, the detector has been disposed on the innermost electrode, and there has been a correlation between the shapes of the electrodes and the position of the first upper detector. That is, there has been a correlation between the shape of the electrodes minimizing the spot size of a primary electron beam irradiating the sample in order for the scanning electron microscope to have high spatial resolution and the mounting position of the detector allowing for high detection performance. Accordingly, there has been a trade-off relationship between spatial resolution and high detection performance of the first upper detector, thereby making it difficult to compromise between the two performances.

In contrast, according to embodiments of the present disclosure, the fourth electrode 540 is provided, and the positions of the first upper detector 610 and/or the fourth electrode 540 may be determined independently of the shapes and positions of the first electrode 510, the second electrode 520, and the third electrode 530. Thus, the positions at which the fourth electrode 540 and/or the first upper detector 610 are disposed may be positions having the highest detection efficiency irrespective of the shapes of the first electrode 510, the second electrode 520, and the third electrode 530.

The first upper detector 610 may detect secondary electrons and backscattered electrons having a trajectory spread by the charged particle beam B irradiating the sample, and may be disposed at a position where the detection efficiency is optimal irrespective of the shape and arrangement of the other electrodes. The second upper detector 620 detects the secondary electrons and the backscattered electrons that have passed through the opening of the fourth electrode.

The main scanner 820 may be disposed on the outer circumferential surface of the first electrode 510. As described above, the main scanner 820 performs high-magnification beam scanning to the charged particle beam B provided through the objective lens 500. High precision scanning of the charged particle beam B may be performed by the sub-scanner 810 disposed on the path of the charged particle beam B in the beam tube 200 and the main scanner 820 performing high-magnification beam scanning.

The sample may be disposed together with the objective lens 500 in a first area V1 in which a first vacuum level is maintained and on a stage. In an embodiment, the stage may be a 5-axis stage able to control the XYZ positions, rotation, and tilt of the sample. A portion of the stage on which sample is placed may be formed of an insulator to be electrically disconnected from the sample.

In an embodiment, the charged particle beam apparatus 10 is divided into the first area V1 in which a first vacuum level is maintained, the second area V2 in which a second vacuum level is maintained, a third area V3 in which a third vacuum level is maintained, and a fourth area V4 in which a fourth vacuum level is maintained. The first to fourth areas V1 to V4 are evacuated to different vacuum levels. In the illustrated embodiment, the fourth area V4 may be an internal area of the electron source 110, and may be divided from the third area V3 by an orifice O with an opening. The fourth area V4 may be maintained a vacuum level on the order of $1 \times 10^{-8}$ Pa by the vacuum pump for electron source 119 included in the electron source 110.

The third area V3 may be divided from the second area V2 by the detector cover 410 to be differentially evacuated. The third area V3 may be evacuated by the third area vacuum pump 142 to be maintained at a vacuum level on the order of $1 \times 10^{-7}$ Pa.

The second area V2 may be divided from the first area V1 through the opening of the fourth electrode 540 to be differentially evacuated. The second area V2 may be evacuated by the second area vacuum pump 144 to be maintained at a vacuum level on the order of $1 \times 10^{-6}$ Pa. In addition, the first area V1 in which the sample is placed may be evacuated by a first pump 146 to be maintained at a vacuum level in the range of $1 \times 10^{-3}$ to $1 \times 10^{-4}$ Pa. As described above, the respective areas may be differentially evacuated by the pumps located in the respective areas to be maintained at desirable vacuum levels.

Figure 3:
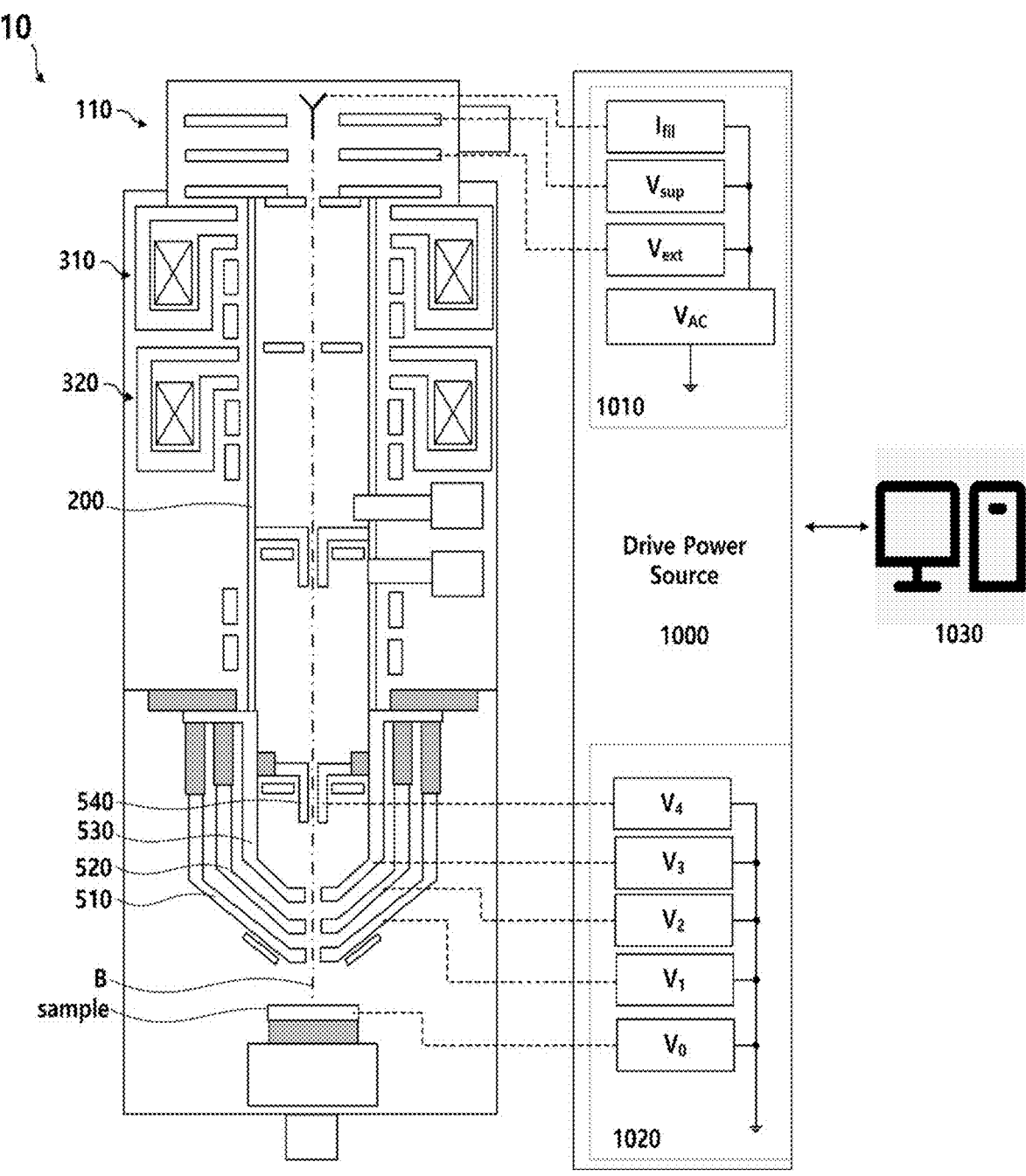
FIG. 3 is a diagram illustrating the connection relationship in the charged particle beam apparatus according to embodiments with a drive power source configured to provide drive power required for the operation of the charged particle beam apparatus.

FIG. 3 is a diagram illustrating the connection relationship in the charged particle beam apparatus 10 according to embodiments with a drive power source 1000 configured to provide drive power required for the operation of the charged particle beam apparatus 10. Referring to FIGS. 1 and 3, the drive power source 1000 may include an electron source drive power source 1010 configured to provide drive power to the electron source 110 and an objective lens drive power source 1020 configured to provide voltages to electrodes included in the objective lenses and the sample. A user may control the charged particle beam apparatus 10 by controlling the drive power source 1000 by means of a user terminal 1030. Data regarding the secondary electrons and the backscattered electrons detected by the charged particle beam apparatus 10 may be provided to a calculator to be calculated, processed, and imaged, so that the image may be displayed to the user by means of the user terminal 1030.

In an embodiment, the electron source drive power source 1000 may include a filament current provider $I_{fil}$ configured to provide current to heat the filament 111, a suppression voltage provider $V_{sup}$ configured to prove a suppression voltage $V_{sup}$ to the suppressor electrode 113, and an extraction voltage provider $V_{ext}$ configured to provide an extraction voltage $V_{ext}$ for extracting charged particles to the extractor electrode 115. The filament current $I_{fil}$, the suppression voltage $V_{sup}$, and the extraction voltage $V_{ext}$ are provided in a manner superimposed with an acceleration voltage $V_{ACC}$ by which the initial energy of the charged particle beam B is determined.

In an embodiment, the objective lens drive power source 1020 may include a first electrode drive power source $V_1$, a second electrode drive power source $V_2$, a third electrode drive power source $V_3$, and a fourth electrode drive power source $V_4$ connected to the first electrode 510, the second electrode 520, the third electrode 530, and the fourth electrode 540, respectively, to provide voltages to the same and a sample drive power source $V_0$ configured to provide a voltage to the sample.

The charged particle beam B is focused on the sample by an electric field generated by voltages which the first electrode drive power source $V_1$, the second electrode drive power source $V_2$, the third electrode drive power source $V_3$, and the fourth electrode drive power source $V_4$ applied to the first electrode 510, the second electrode 520, the third electrode 530, and the fourth electrode 540, respectively.

The user may control the energy of the charged particle beam irradiating the sample by means of the user terminal 1030. In an embodiment, the energy of the charged particle beam provided to the sample may be controlled. In an example, the user may provide the third electrode drive voltage $V_3$ to the third electrode 530 by controlling the third electrode drive power source $V_3$ and perform control so that the first electrode drive voltage $V_1$ provided to the first electrode 510 is lower than the third electrode drive voltage $V_3$.

By controlling the higher or lower relationship between the first electrode drive voltage $V_1$ provided to the first electrode 510 and the third electrode drive voltage $V_3$ provided to the third electrode 530 in this manner, the energy of the charged particle beam irradiating the sample may be controlled.

In an embodiment, the first electrode voltage $V_1$ provided to the first electrode 510 may be the same as the sample voltage $V_0$ provided to the sample. In another embodiment, the first electrode voltage $V_1$ may be set as a potential between a sample voltage $V_0$–50 V and a sample voltage $V_0$+50 V.

The second electrode focuses the charged particle beam B on the sample. In an embodiment, the user may adjust the voltage $V_2$ applied to the second electrode 520 by controlling the second electrode drive power source $V_2$ using the user terminal 1030, so that the charged particle beam B may be focused on the sample to correspond to the working distance WD between the objective lens 500 and the sample or the energy of the electron beam.

Most of the secondary electrons and the backscattered electrons formed due to the charged particle beam B irradiating the sample are pulled into the objective lens 500 and are detected by the first upper detector 610. The fourth electrode 540 has the first upper detector 610 mounted thereon, has a cylindrical portion protruding in the direction of the sample, and has an opening in the central portion thereof. The cylindrical portion may reduce the solid angle of the primary electron beam with respect to the detector, thereby reducing abnormal deflection in the trajectory of the primary electron beam due to the charging of the insulating surface of the detector. The secondary electrons and the backscattered electrons that have passed through the opening of the fourth electrode 540 travel and diverge to the top portion of the beam tube and are detected by the second upper detector.

Figure 4:
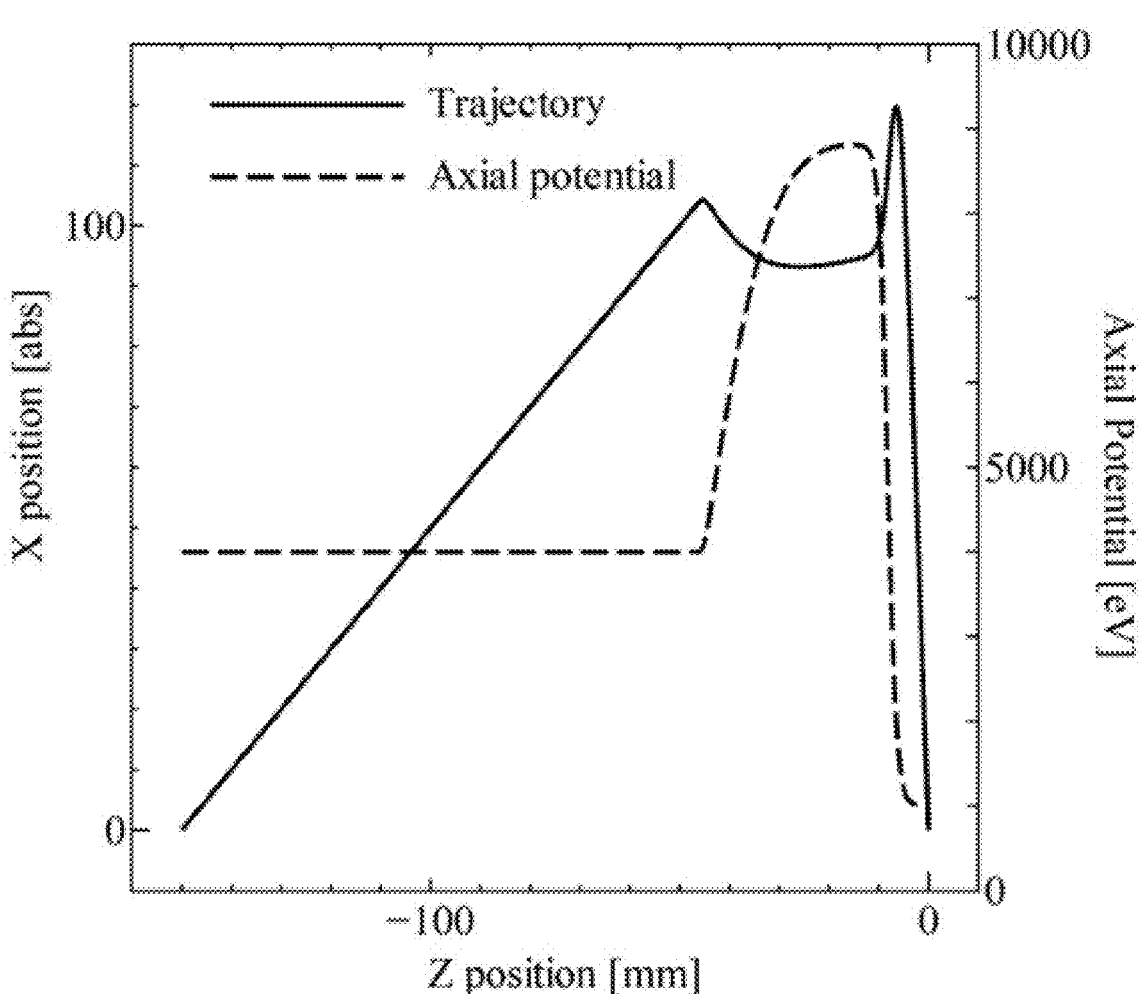
FIG. 4 illustrates an example of calculation of the trajectory of a primary electron beam and axial potential of an electrostatic objective lens part of the charged particle beam apparatus according to embodiments.

FIG. 4 illustrates an example of calculation of the trajectory of a primary electron beam and axial potential of an electrostatic objective lens part of the charged particle beam apparatus according to embodiments.

Values of potential $V_1$ to $V_4$ applied to the first to fourth electrodes are 1000 V, 8155 V, 4000 V, and 4000 V, respectively, and sample potential $V_0$ is 1000 V. These potential values are relative values with respect to 0 V of the electron source 110. As illustrated, the same potential is applied to the third electrode and the fourth electrode. Accordingly, there are advantages in that the electrodes and the detectors may be prevented from contamination and damage and detection performance may be improved, as will be described below.

As illustrated in FIG. 4, axial potential in the range of –150 to –50 mm of the Z-axis corresponding to the internal area of the objective lens 500 is 4000 V determined by the potential of the third electrode and the fourth electrode. 8155 V is applied to the second electrode 520 so that the charged particle beam B is controlled to be focused on the sample. The voltage $V_1$ of the first electrode 510 is set to be 1000 V, the potential of which is the same as that of the sample voltage $V_0$.

The trajectory of the primary electron beam is required to be converged on the optical axis at a position of –150 mm by the condenser lenses 310 and 320, be incident on the objective lens 500, and then be focused on the sample surface at a position of Z=0 mm.

In the objective lens 500, the electron beam diverges due to the acceleration between the third electrode 530 and the second electrode 520, is converged due to the deceleration at the boundary between the second electrode 520 and the first electrode 510, and is focused on the sample.

In the electrostatic objective lens 500 according to embodiments, by adjusting the second electrode voltage $V_2$ applied to the second electrode 520, the electron beam may be focused on the sample, and the focusing conditions may be controlled when the working distance WD between the objective lens 500 and the sample or the energy of the electron beam is changed. In addition, the second electrode voltage $V_2$ provided to the second electrode 520 may be set independently of the third electrode voltage $V_3$ provided to the third electrode 530 and the potential of the beam tube 200. In addition, when the focusing is adjusted by changing the second electrode voltage $V_2$, the third electrode voltage $V_3$ and the fourth electrode voltage $V_4$ affecting the detection efficiency may be maintained constant, and the signal detection efficiency of the electron beam may be maintained constant. To realize the illustrated axial potential, two methods of providing voltages may be used. As the first method, when the sample is grounded (0 V) and the beam tube 200 inside the column is set to be a positive potential, voltages $V_0$=0 V, $V_1$=0 V, $V_2$=+7155 V, $V_3$=+3000 V, and $V_4$=+3000 V are applied. An acceleration voltage applied to the electron source 110 may be set as $V_{ACC}$=–1000 V.

As the second method, when the sample has negative potential and the beam tube 200 inside the column is grounded (0 V), voltages $V_0$=–3000 V, $V_1$=–3000 V, $V_2$=+4155 V, $V_3$=0 V, and $V_4$=0 V are applied. An acceleration voltage applied to the electron source 110 is set as $V_{ACC}$=–

4000 V. When the SEM is used alone, both the two voltage application methods are available.

Because the sample side of the spectrometer analyzing the energy of the electron beam is often grounded, the first method may be used to simultaneously operate the SEM and the spectrometer.

Figure 5:
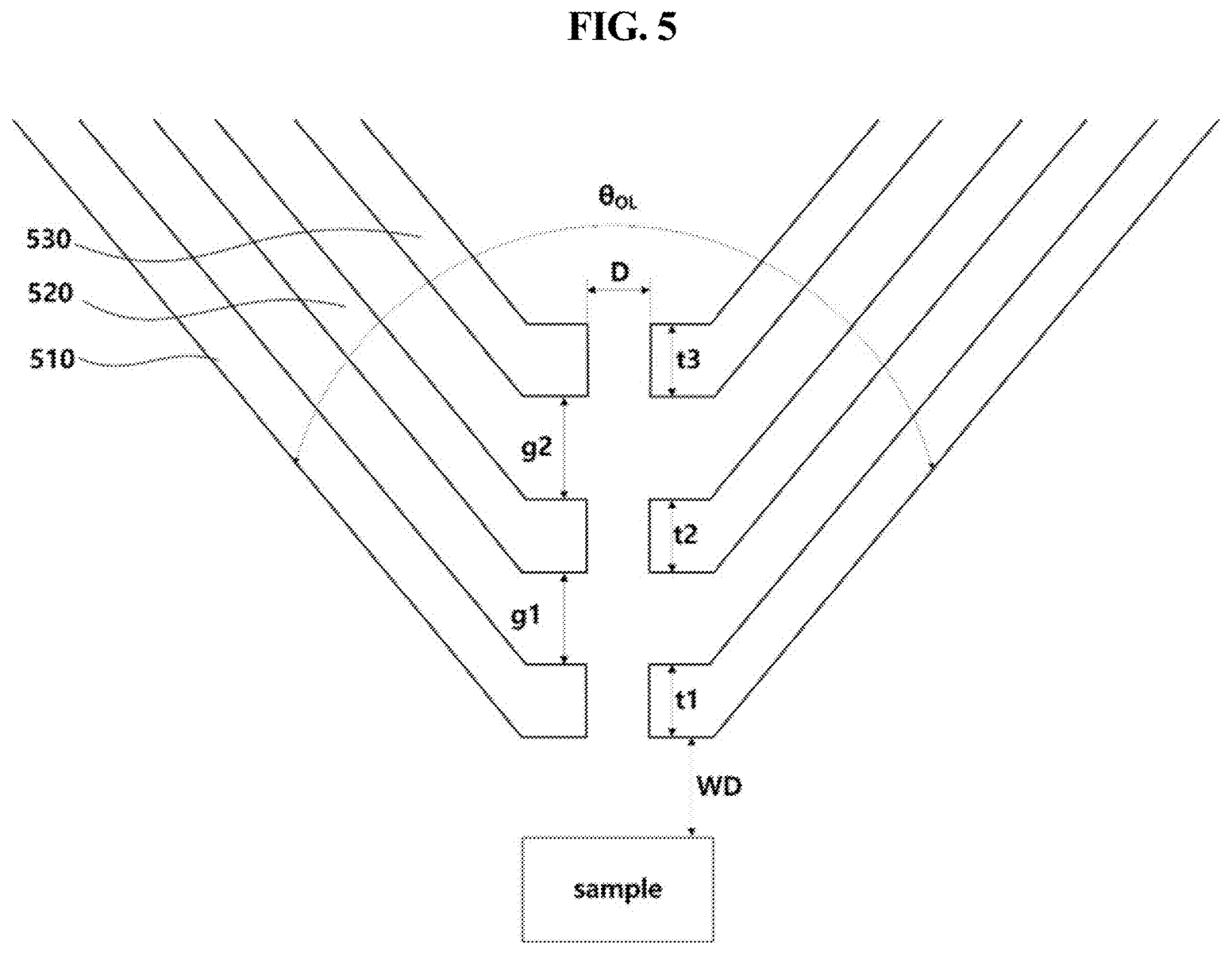
Figure 6:
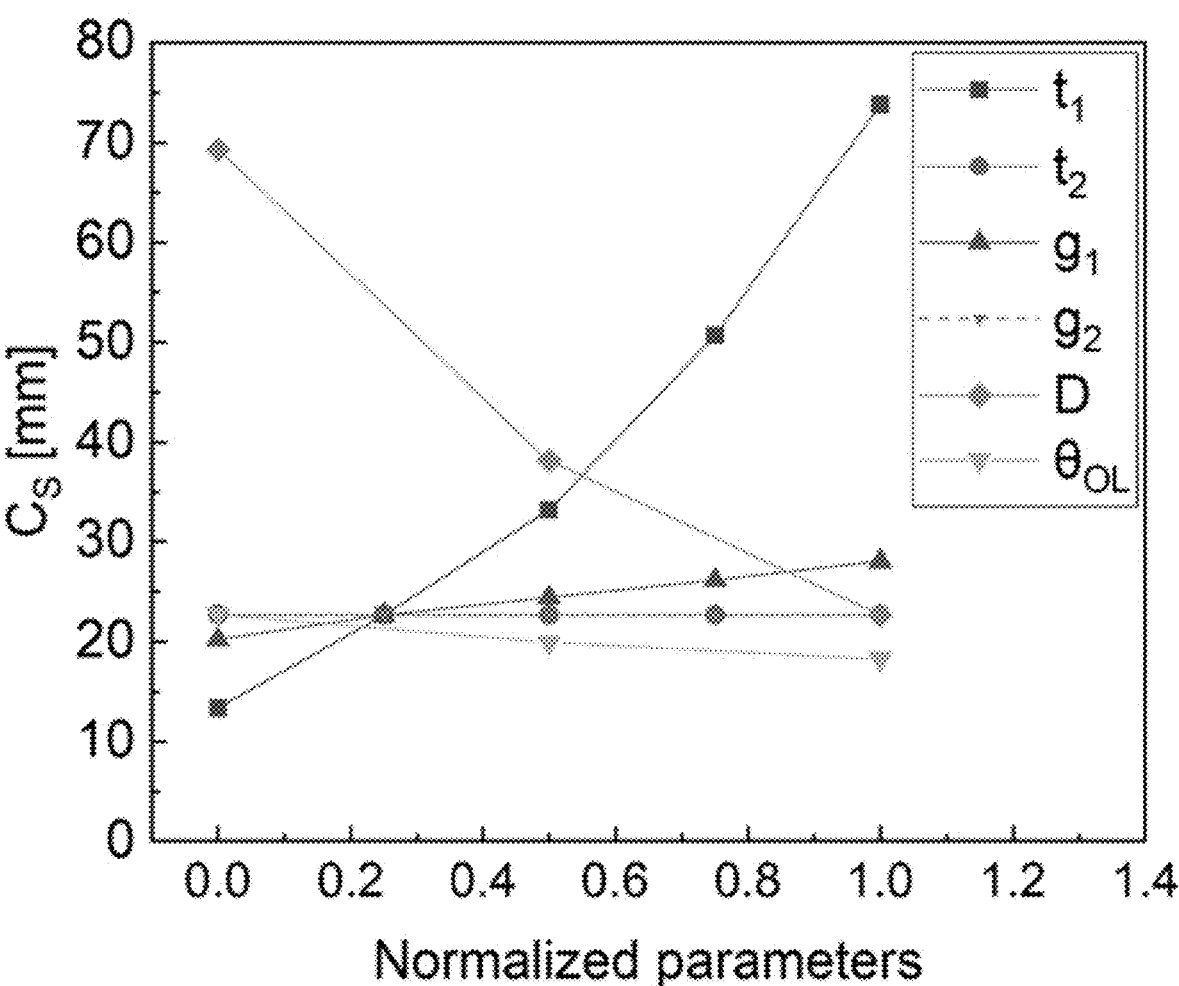
FIG. 6 is a diagram illustrating spherical aberration of the objective lens according to normalized geometric dimensional parameters of the first electrode, the second electrode, and the third electrode.
Figure 7:
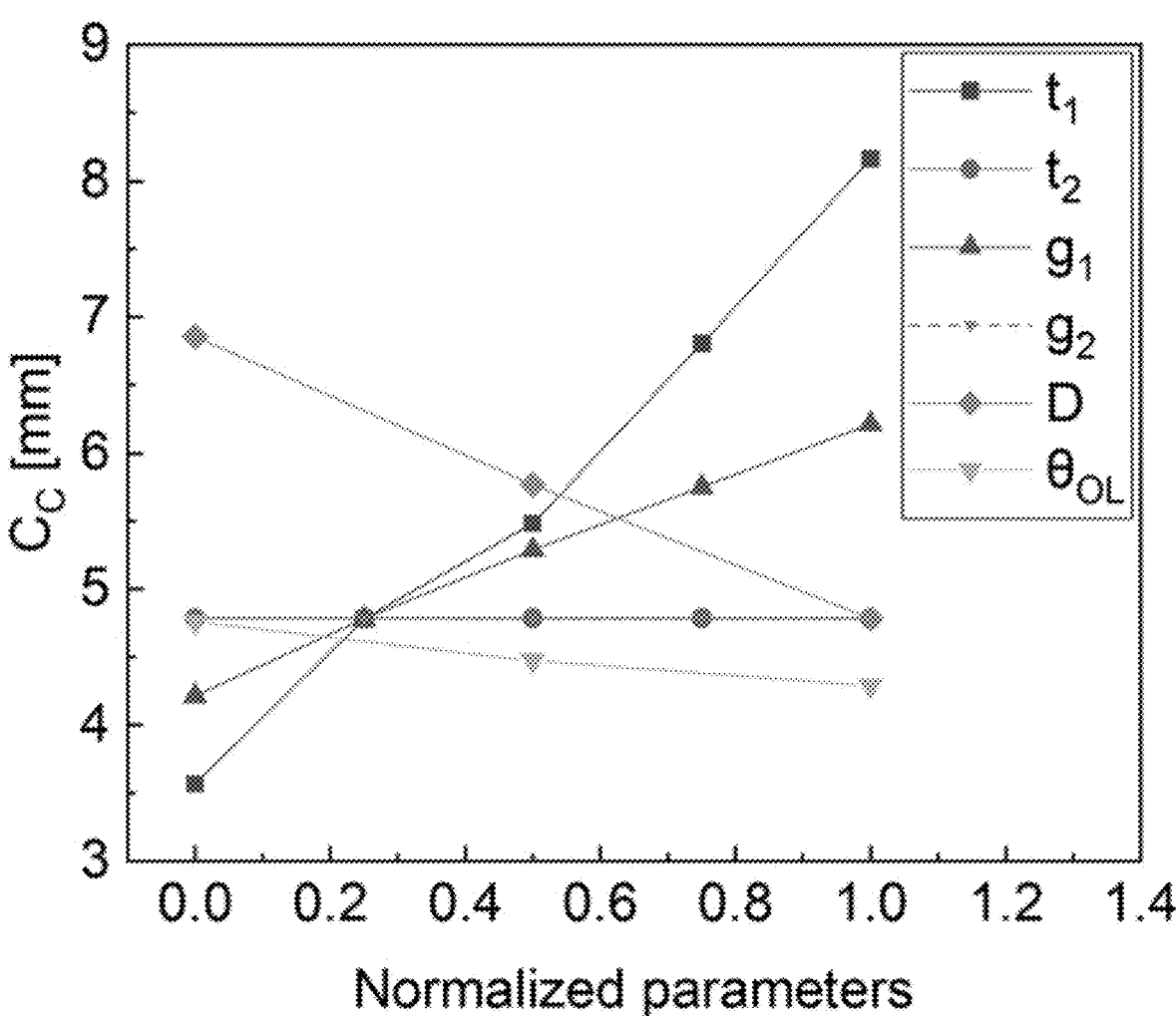
FIG. 7 is a diagram illustrating chromatic aberration of the objective lens according to normalized geometric dimensional parameters of the first electrode, the second electrode, and the third electrode.

FIG. 5 is a diagram schematically illustrating the geometric dimensional parameters of the first electrode, the second electrode, and the third electrode according to embodiments. FIG. 6 is a diagram illustrating spherical aberration Cs of the objective lens 500 according to normalized geometric dimensional parameters of the first electrode, the second electrode, and the third electrode. FIG. 7 is a diagram illustrating chromatic aberration Cc of the objective lens 500 according to normalized geometric dimensional parameters of the first electrode, the second electrode, and the third electrode.

Referring to FIGS. 5 to 7, each of the tips of the first electrode 510, the second electrode 520, and the third electrode 530 may have a conical shape. The angle of the cone is $\theta_{OL}$. The tips of the cones of the first electrode 510, the second electrode 520, and the third electrode 530 are cut to be parallel to each other, and form an opening having a diameter D.

The thickness of the tip of the first electrode 510 is t1, the thickness of the tip of the second electrode 520 is t2, and the thickness of the tip of the third electrode 530 is t3. The thickness of the tip of the electrode is illustrated as being different from the thickness of the remaining portion of the electrode in the illustrated embodiment, but this is for illustrative purposes only. Rather, the thickness of the tip of the electrode may be the same as the thickness of the remaining portion of the electrode. In addition, the gap distance between the first electrode 510 and the second electrode 520 is g1, and the gap between the second electrode 520 and the third electrode 530 is g2.

In FIGS. 6 and 7, the horizontal axis indicates normalized parameters, while the vertical axis indicates calculated values of the aberration. In the normalization, an equation (corresponding value-minimum)/(maximum-minimum) was used. The smaller the value of the vertical value is, the higher the performance of the objective lens is. For each geometric dimension value, the greater the slope value of the graph, the more important the target geometric dimension is.

In the spherical aberration Cs illustrated in FIG. 6, it can be seen that the thickness t1 of the tip of the first electrode 510 and the diameter D of the opening of the electrode are parameters having a more significant effect on the resulting value than other parameters. In the chromatic aberration Cc illustrated in FIG. 7, it can be seen that the gap g1 between the first and second electrodes is also a parameter having a more significant effect on the resulting value than other parameters.

By setting the desirable aberration factor and referring to the graphs of FIGS. 6 and 7, geometric dimensions for realizing a high-performance electrostatic lens below the reference value may be determined. Specifically, the diameter D of the opening of each of the electrodes is required to be 3 mm or more, the thickness t1 of the first electrode tip is required to be 3 mm or less, and the gap g1 between the first and second electrodes is required to be 4 mm or less such that the spherical aberration Cs is 40 mm or less and chromatic aberration Cc is 6 mm or less. The same calculation may be performed for other beam energy and working distance WD conditions to realize a high-performance objective lens with a small aberration.

In addition, in FIGS. 6 and 7, calculations were performed for the cone angle $\theta_{OL}$ of the electrostatic objective lens, which is an important design condition. It can be seen that a condition with a greater cone angle results in a lens with a smaller aberration factor and better performance, although dependency is small. The cone angle meeting the specifications for both the electrostatic objective lens of the SEM and the objective lens of the spectrometer may be determined using FIGS. 6 and 7.

Figure 8A:
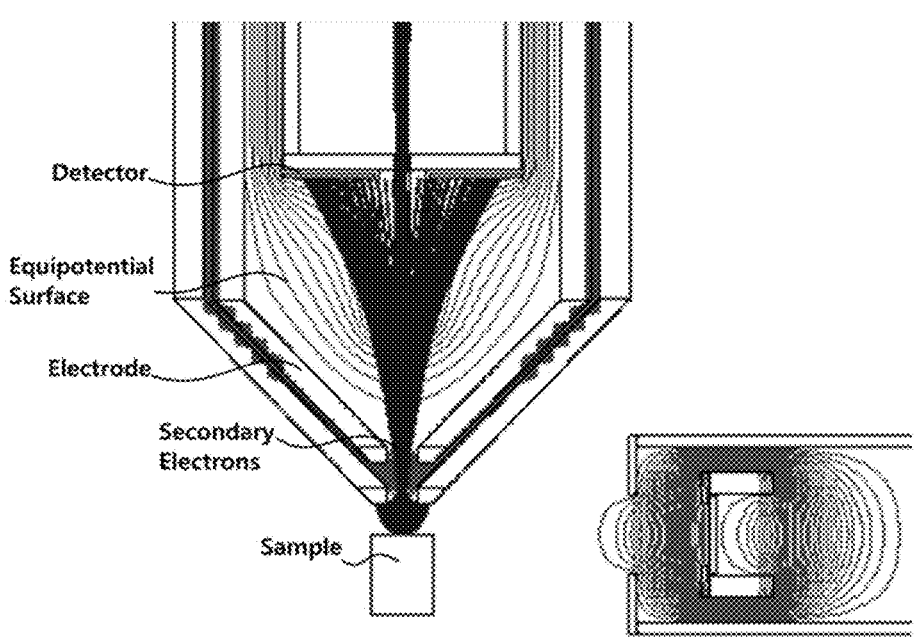
FIG. 8A illustrates an example of a result of calculating the trajectory of secondary electrons generated on the sample surface in the objective lens part of a related-art charged particle beam apparatus.

FIG. 8A illustrates an example of a result of calculating the trajectory of secondary electrons generated on the sample surface in the objective lens part of a related-art charged particle beam apparatus. The equipotential surface of the electrostatic lens is indicated with grey lines, and the trajectories of secondary electrons are indicated with black lines. As illustrated, a number of the equipotential surfaces are formed between the detector and the electrode, and indicates the occurrence of a potential difference. Therefore, the secondary electrons generated from the sample are accelerated by the potential difference between the electrode and the detector and collide with the electrode to generate unintended secondary electrons, which are detected by the detector and act as undesirable noise. In addition, the secondary electrons generated on the surface of the detector collide with the electrode having high potential to contaminate the inner wall of the electrode, thereby causing the field to be unbalanced and eventually degrading the performance of the objective lens.

After a period of use of the objective lens part and the detector of a related-art charged particle beam apparatus, the routine replacement of the detector requires the objective lens to be disassembled by removing the electrodes. This is inconvenient and inefficient because the electrodes must be reassembled with their center position precisely aligned with the other electrodes.

Figure 8B:
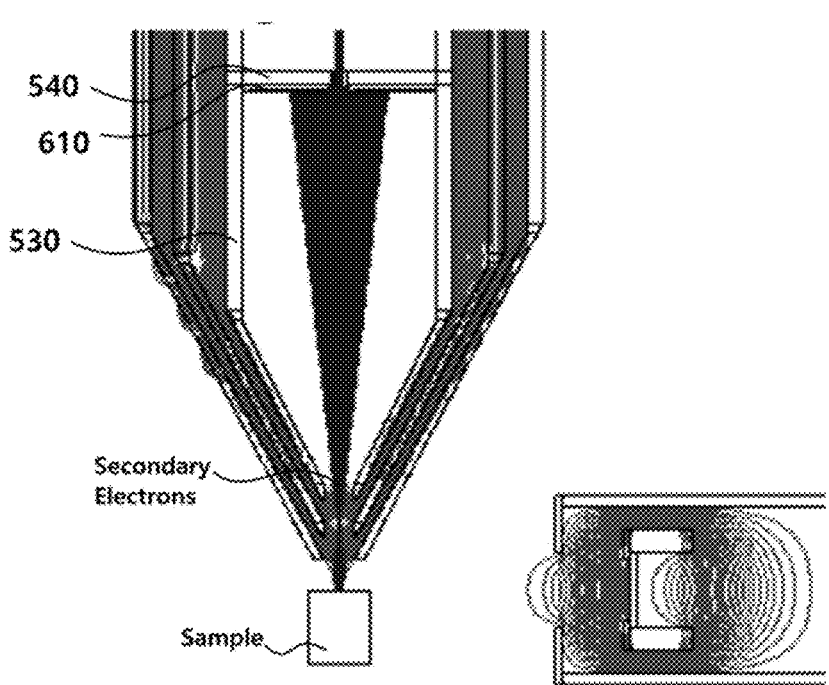
FIG. 8B illustrates an example of a result of calculating the trajectory of secondary electrons generated on the surface of the sample in the objective lens part according to embodiments.

FIG. 8B illustrates an example of a result of calculating the trajectory of secondary electrons generated on the surface of the sample in the objective lens part according to embodiments. Referring to FIG. 8B, it can be seen that the secondary electrons generated from the sample are pulled into the objective lens without colliding with the tip, and the detection efficiency is improved due to an increase in the amount of the secondary electrons passing through the opening because the detector is positioned higher compared to the related-art.

In addition, in the related art, a number of equipotential lines are visible due to the potential difference between the detector and the electrode. In contrast, in embodiments, there is no potential difference between the third electrode and the fourth electrode or a potential difference of less than 50 V is created. This means that because the secondary electrons from the sample do not strike the electrodes, the contamination of the electrodes and the degradation of the electrostatic lens may be prevented, and long-term stable operation may be enabled. Thus, when the potential difference between the fourth electrode and the third electrode is set to be +50 V or less, the secondary electrons generated by the detector will return completely toward the upper detector, thereby more effectively preventing electrode contamination. In an embodiment, it can be seen that the potential difference between the second electrode and the third electrode is 4000 V or more, and when the potential difference between the fourth electrode and the third electrode is about 50 V, the potential difference is negligible.

Furthermore, in embodiments, when the first upper detector 610 is replaced for the routine replacement, removing the fourth electrode 540 may not require removing the second and third electrodes of the objective lens to facilitate the replacement of the first upper detector 610, thereby facilitating the repair.

The present disclosure has been described with reference to the embodiments illustrated in the drawings, but these are for illustrative purposes only and those skilled in the art will understand that various modifications and other equivalent embodiments are possible therefrom. Accordingly, the true scope of technical protection of the present disclosure should be defined by the appended claims.

What is claimed is:

1. An objective lens for a charged particle beam apparatus that provides a charged particle beam to a sample, the objective lens comprising:

a first electrode exposed to face a sample;

a second electrode configured to focus a charged particle beam to the sample;

a third electrode comprising a conical tip and a body extending from the tip; and a fourth electrode located in the body of the third electrode, wherein each of the first electrode, the second electrode, the third electrode, and the fourth electrode has a through-hole, and the charged particle beam is provided to the sample through the through-hole in response to a voltage applied, wherein each of the first electrode and second electrode comprises the conical tip and the body extending from the tip, the second electrode is located within the first electrode with a gap from the first electrode, and the third electrode is located within the second electrode with a gap from the second electrode.

2. The objective lens of claim 1, wherein the fourth electrode is mounted with a detector configured to detect secondary electrons and backscattered electrons formed by providing the charged particle beam to the sample, and the fourth electrode is disposed at a position having highest detection efficiency of the secondary electrons and the backscattered electrons irrespective of shapes of the first electrode, the second electrode, and the third electrode.

3. The objective lens of claim 1, wherein the third electrode further comprises a flange extending from the body of the third electrode, the first electrode further comprises a first electrode insulator connected to the flange, and the second electrode further comprises a second electrode insulator connected to the flange.

4. The objective lens of claim 1, wherein the second electrode is provided with a voltage corresponding to one of a distance between the first electrode and the sample and the energy of the charged particle beam.

5. The objective lens of claim 1, wherein a voltage difference of 50 V or less is formed between the third electrode and the fourth electrode.

6. The objective lens of claim 1, wherein a voltage provided to the second electrode is independent of a voltage provided to the third electrode.

7. The objective lens of claim 1, wherein the objective lens comprises an objective lens of a scanning electron microscope.

8. An objective lens for a charged particle beam apparatus that provides a charged particle beam to a sample, the objective lens comprising:

a first electrode comprising a conical tip and a body extending from the tip, the first electrode being exposed to face a sample;

a second electrode comprising a conical tip and a body extending from the tip, exposed in the first electrode, and configured to focus a charged particle beam to the sample;

a third electrode comprising a conical tip and a body extending from the tip, the third electrode being located in the second electrode; and a fourth electrode located in the body of the third electrode, wherein each of the first electrode, the second electrode, the third electrode, and the fourth electrode has a through-hole, and the charged particle beam is provided to the sample through the through-hole in response to an electric field generated by one or more voltages applied to at least one of the first electrode, the second electrode, the third electrode, and the fourth electrode.

9. The objective lens of claim 8, wherein the fourth electrode is mounted with a detector configured to detect secondary electrons and backscattered electrons formed by providing the charged particle beam to the sample, and the fourth electrode is disposed at a position having highest detection efficiency of the secondary electrons and the backscattered electrons irrespective of shapes of the first electrode, the second electrode, and the third electrode.

10. The objective lens of claim 8, wherein the tip of the first electrode, the tip of the second electrode, and the tip of the third electrode comprise distal ends in parallel to each other, respectively, and the thickness of the tip of the first electrode is greater than 0 mm and is equal to or less than 3 mm.

11. The objective lens of claim 8, wherein a gap between the first electrode and the second electrode is greater than 0 mm and is equal to or less than 4 mm.

12. The objective lens of claim 8, wherein the diameter of the through-hole provided in each of the first electrode, the second electrode, and the third electrode is equal to or greater than 3 mm.

13. The objective lens of claim 8, wherein the objective lens comprises an objective lens of a scanning electron microscope.

14. A charged particle beam apparatus comprising:

a charged particle source;

one or more condenser lenses configured to focus a charged particle beam;

an objective lens configured to imaging a sample by irradiating the sample with the charged particle beam; and a detector configured to detect secondary electrons and backscattered electrons generated from the sample, wherein the objective lens comprises:

a first electrode comprising a conical tip having a through-hole and a body extending from the tip, the first electrode being exposed to face a sample;

a second electrode comprising a conical tip having a through-hole and a body extending from the tip, exposed in the first electrode, and configured to focus a charged particle beam to the sample;

a third electrode comprising a conical tip having a through-hole and a body extending from the tip, the third electrode being located in the second electrode; and a fourth electrode located in the body of the third electrode and having a through-hole.

15. The charged particle beam apparatus of claim 14, wherein the detector comprises:

a first detector configured to detect the secondary electrons and the backscattered electrons; and a second detector configured to detect the secondary electrons and the backscattered electrons that have passed through the first detector.

16. The charged particle beam apparatus of claim 15, wherein the first detector is mounted on the fourth electrode, and is disposed at a position having highest detection efficiency of the secondary electrons and the backscattered electrons irrespective of shapes of the first electrode, the second electrode, and the third electrode.

17. The charged particle beam apparatus of claim 14, wherein the second electrode is provided with a voltage corresponding to one of a distance between the first electrode and the sample and the energy of the charged particle beam.

18. The charged particle beam apparatus of claim 17, wherein a voltage provided to the second electrode is independent of a voltage provided to the third electrode.

19. The charged particle beam apparatus of claim 14, wherein a voltage difference of 50 V or less is formed between the third electrode and the fourth electrode.

20. The charged particle beam apparatus of claim 14, wherein a gap between the first electrode and the second electrode is equal to or less than 4 mm, the thickness of the tip of the first electrode is equal to or less than 3 mm, and the diameter of the through-hole provided in each of the first electrode, the second electrode, and the third electrode is equal to or greater than 3 mm.

21. The charged particle beam apparatus of claim 14, wherein the charged particle beam apparatus comprises one of a scanning electron microscope, an analyzer comprising a spectrometer configured to analyze electron beam energy, and a sample processing apparatus.

* * * * *